US008547165B1

(12) United States Patent
Bernardinis

(10) Patent No.: US 8,547,165 B1
(45) Date of Patent: Oct. 1, 2013

(54) ADJUSTABLE SECOND-ORDER-COMPENSATION BANDGAP REFERENCE

(75) Inventor: Gabriele Bernardinis, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/414,200

(22) Filed: Mar. 7, 2012

(51) Int. Cl.
*H01L 35/00* (2006.01)

(52) U.S. Cl.
USPC .......... 327/513

(58) Field of Classification Search
USPC .......... 327/512, 513, 539
See application file for complete search history.

(56) References Cited

U.S. PATENT DOCUMENTS

| | | | | |
|---|---|---|---|---|
| 7,495,505 | B2 * | 2/2009 | Chang et al. | 327/539 |
| 7,705,662 | B2 * | 4/2010 | Ng et al. | 327/539 |
| 7,965,129 | B1 * | 6/2011 | Wadhwa et al. | 327/513 |
| 8,269,548 | B2 * | 9/2012 | Huang | 327/513 |
| 8,278,994 | B2 * | 10/2012 | Kung et al. | 327/538 |

* cited by examiner

*Primary Examiner* — Jeffrey Zweizig
(74) *Attorney, Agent, or Firm* — Schwegman Lundberg & Woessner, P.A.

(57) ABSTRACT

A voltage reference is produced from PTAT, CTAT, and non-linear current components generated in isolation from each other and combined to create the voltage reference.

20 Claims, 8 Drawing Sheets

ADJUSTABLE SECOND-ORDER-COMPENSATION BANDGAP REFERENCE

TECHNICAL FIELD

Embodiments of the invention generally relate to voltage references and, more particularly, to bandgap-reference circuits.

BACKGROUND

Many transistor-based electronic circuits will function properly only if they are supplied a very precise power-supply voltage; if the supply voltage drifts too far out of an acceptable tolerance, the transistors it powers may function unpredictably, poorly, or not at all. Many factors may affect the value of the supply voltage, including fluctuations in a power source (e.g., a battery or AC mains supply), changes in temperature, or changes in the load on the power supply. One way that a power supply may maintain a more stable output voltage is to generate a "reference voltage": a voltage derived from a fixed, stable, and constant value such as (in many transistor-based supplies) the energy bandgap intrinsic to a given material. The energy bandgap of silicon, for example, is approximately 1.11 electron-volts at room temperature, regardless of its power source or loading. Because the energy bandgap is susceptible to changes in temperature, however, a simple reference-voltage generation circuit generates two reference values: a first one that changes in the same direction as a change in the temperature (a so-called proportional-to-absolute-temperature or "PTAT" value) and a second one that changes in the direction opposed to the temperature change (a complementary-to-absolute-temperature or "CTAT" value). The two values are added together and, to first order, the temperature dependencies cancel each other out. FIG. 1A illustrates a simple bandgap-reference circuit 100 that includes a first transistor 102 configured for generating a CTAT value 104 across a first resistor 106 and a second transistor 108 for generating a PTAT value 110 across a second resistor 112. The output value 114 combines the two generated values 104, 110.

As supply voltages have dropped and transistors have become less tolerant of variations, however, the simple bandgap-reference circuit 100 shown in FIG. 1A has proved inadequate in some applications because it does not compensate for second-order effects of temperature on the bandgap value (which are explained in greater detail below). A more sophisticated bandgap-reference circuit 150, shown in FIG. 1B, includes first-order PTAT and CTAT value-generating transistors 152, 154 (analogous to the transistors 102, 108 in the simpler circuit 100 of FIG. 1A) but also includes a third transistor 156 that is configured to generate a second-order temperature factor. The first two transistors 152, 154 generate PTAT and CTAT currents 158, 160 (which are tapped via a buffer 162 and fed back to control current sources 164). A portion of the current 166 generated by the third transistor 156 is subtracted from the PTAT/CTAT currents 158, 160 via resistors 168, 170, thereby accounting for the second-order effects. The output current is mirrored using a current mirror 172, and an output voltage is developed at an output terminal 174 across an output resistor 176.

While the second-order circuit 150 of FIG. 1B improves upon the simpler circuit 100 of FIG. 1A, it is designed based on an approximation of the second-order current 166 that may not always hold true. Specifically, it is assumed that the current 166 generated by the third transistor 156 is not significantly affected by the additional contributions added from the PTAT/CTAT currents 158, 160. In reality, however, this may not always be the case; the third transistor 156 may be calibrated to generate the second-order factor (the "α" factor, as referred to throughout this application) at a particular temperature (for example), but changing conditions may upset the balance of currents flowing into it, producing an error.

Furthermore, the calibration/characterization of the transistors 152, 154, 156 must generally be predetermined by a computer simulation of the circuit 150 because, once manufactured, the circuit 150 cannot be adjusted. The computer model of the transistors 152, 154, 156 may not be accurate enough, however, to precisely determine the value of a process-dependent factor (referred to herein as "XTI" and explained in greater detail below). This XTI parameter may be especially difficult to predict in CMOS processes, in which models of bipolar junction transistors (BJTs) are not well-developed. The actual value of this process-dependent XTI factor (as explained in greater detail below) may thus differ from the simulated or predicted value, further increasing the error of the circuit 150. This error may be unacceptable in some applications; a need therefore exists for an adjustable voltage-reference circuit that correctly and robustly cancels out second-order temperature effects in its generated output.

SUMMARY

Various aspects of the systems and methods described herein include deriving each term of a temperature-independent reference voltage individually (i.e., in isolation from each other) and combining them in a way such that they do not interfere with each other. In one embodiment, the terms are generated as currents and summed together; the resulting summed current is then transformed back into a temperature-independent and second-order-corrected output voltage. The process-dependent XTI factor may be adjusted after manufacture by tuning a resistor ratio to exactly match the measured process factor, thereby overcoming any possible inaccuracy in the BJT simulation models.

In one aspect, a system for generating a voltage reference includes three blocks and an output circuit. The first block generates a proportional-to-absolute-temperature ("PTAT") current, the second block generates a complementary-to-absolute-temperature ("CTAT") current, and the third block generates a nonlinear current in isolation from the generating of the PTAT and CTAT currents. The output circuit combines the PTAT current, CTAT current, and nonlinear current to create an output reference voltage.

The nonlinear current may be proportional to $T\times\ln(T/T\mathbf{0})$. The first block may include a trimmable resistor for balancing first-order components of the PTAT and CTAT currents. A current DAC may trim the trimmable resistor and the same or different current DAC may compensate for a process-dependent value by trimming an output resistance. The third block may further include a trimmable resistor for adjusting the nonlinear current to cancel out second-order effects of temperature from the PTAT and CTAT currents and/or a BJT with an inaccessible collector terminal. An amplifier, which may include a chopping circuit for chopping its input values, may isolate the nonlinear current. A chopping circuit may chop an output current, and the first block may include a chopping circuit for chopping resistors used to generate the PTAT current.

In another aspect, a method of generating a voltage reference includes generating a proportional-to-absolute-temperature ("PTAT") current, generating a complementary-to-absolute-temperature ("CTAT") current, and generating a nonlinear current in isolation from the generating of the PTAT and CTAT currents. The PTAT current, CTAT current, and nonlinear current are combined to create an output reference voltage.

The nonlinear current may be proportional to T×ln(T/T0). A ratio between the PTAT and CTAT currents may be adjusted (by trimming a resistor) to cancel out first-order effects of temperature in the PTAT and CTAT currents. A scaling factor applied to the nonlinear current may be adjusted (by trimming a resistor) to cancel out second-order effects of temperature from the PTAT and CTAT currents. Two parameters (e.g., PTAT currents) may be chopped to reduce a mismatch between circuit components (e.g., resistors). A process-dependent variable may be compensated for by, e.g., trimming an output resistor.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. In the following description, various embodiments of the present invention are described with reference to the following drawings, in which.

DETAILED DESCRIPTION

1. Overview and Methodology

Described herein are various embodiments of methods and systems for generating a reference voltage that corrects for the second-order effects of temperature on the bandgap voltage while isolating the generation of each component of the output voltage and allowing for post-manufacturing adjustment of the "α" coefficient used to generate the second-order component. Three semiconductor devices (e.g., diode-connected BJTs) are used to separately generate a PTAT current, a CTAT current, and a third current proportional to a nonlinear, second-order component of the bandgap's value with respect to temperature. In one embodiment, buffers are used to isolate each device. The "XTI" factor, which may not be correctly identified via simulation alone, may be defined via characterization; once identified, its value is stable and its variation over time may be monitored through further characterization. In one embodiment, the invention uses only substrate-based PNP BJTs; in many CMOS processes, NPN BJTs are unavailable and/or access to the BJT's collector terminal is impossible.

The bandgap reference value of silicon is accessible by measuring the base-emitter voltage ("$V_{BE}$") of a diode-connected BJT. This voltage varies nonlinearly in accordance with the second-order term $$\alpha T \ln \frac{T}{T_0}$$

that appears below in Equation (1).

$$V_{BE}(T) \propto \alpha T \ln \frac{T}{T_0} \tag{1}$$

In one embodiment, the present invention generates the nonlinear, second-order term of Equation (1) in isolation, scales it, and subtracts it from the current resulting from the sum of the first-order bandgap currents, PTAT and CTAT. Note that, throughout this application, the scaling factors applied to the PTAT and CTAT values are β and γ, respectively, making the sum of the three currents equal to $(\alpha T \times \ln(T/T_0)) + ((\beta \times PTAT) + (\gamma \times CTAT))$. In particular, the current based on Equation (1) is used to cancel out a nonlinear component of the generated CTAT current. The value of the α coefficient of $V_{BE}(T)$ in Equation (1) depends at least in part on the temperature dependency of the bias current through the junction of the BJT generating the term. The use of three buffers (in one embodiment, transconductance amplifiers) isolates the three current components PTAT, CTAT and $T \times \ln(T/T_0)$ from each other.

Figure 1A:
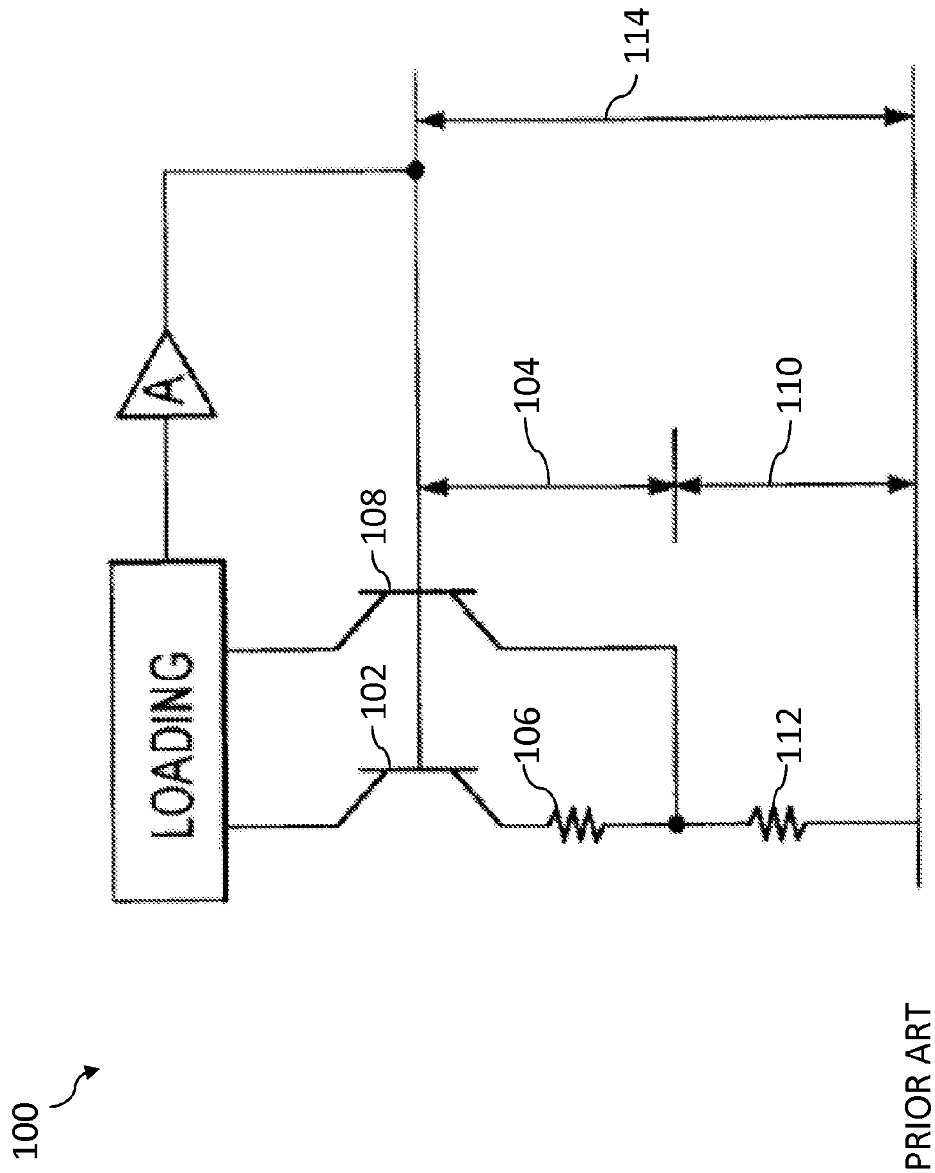
FIG. 1A PRIOR ART
FIG. 1A illustrates a conventional first-order-compensating bandgap voltage-reference circuit.
Figure 1B:
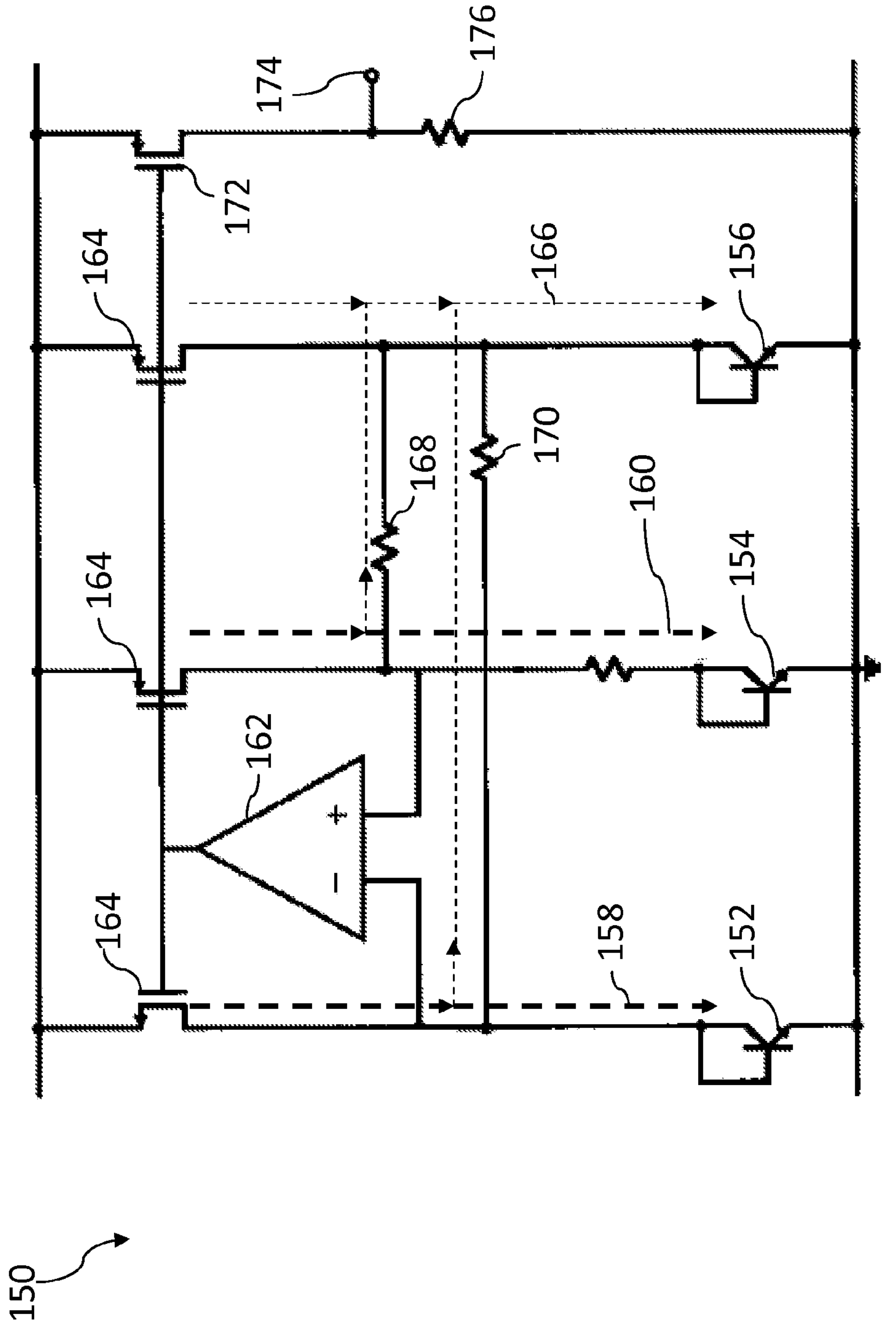
PRIOR ART FIG. 1B
FIG. 1B illustrates a conventional second-order-compensating bandgap voltage-reference circuit.
Figure 2:
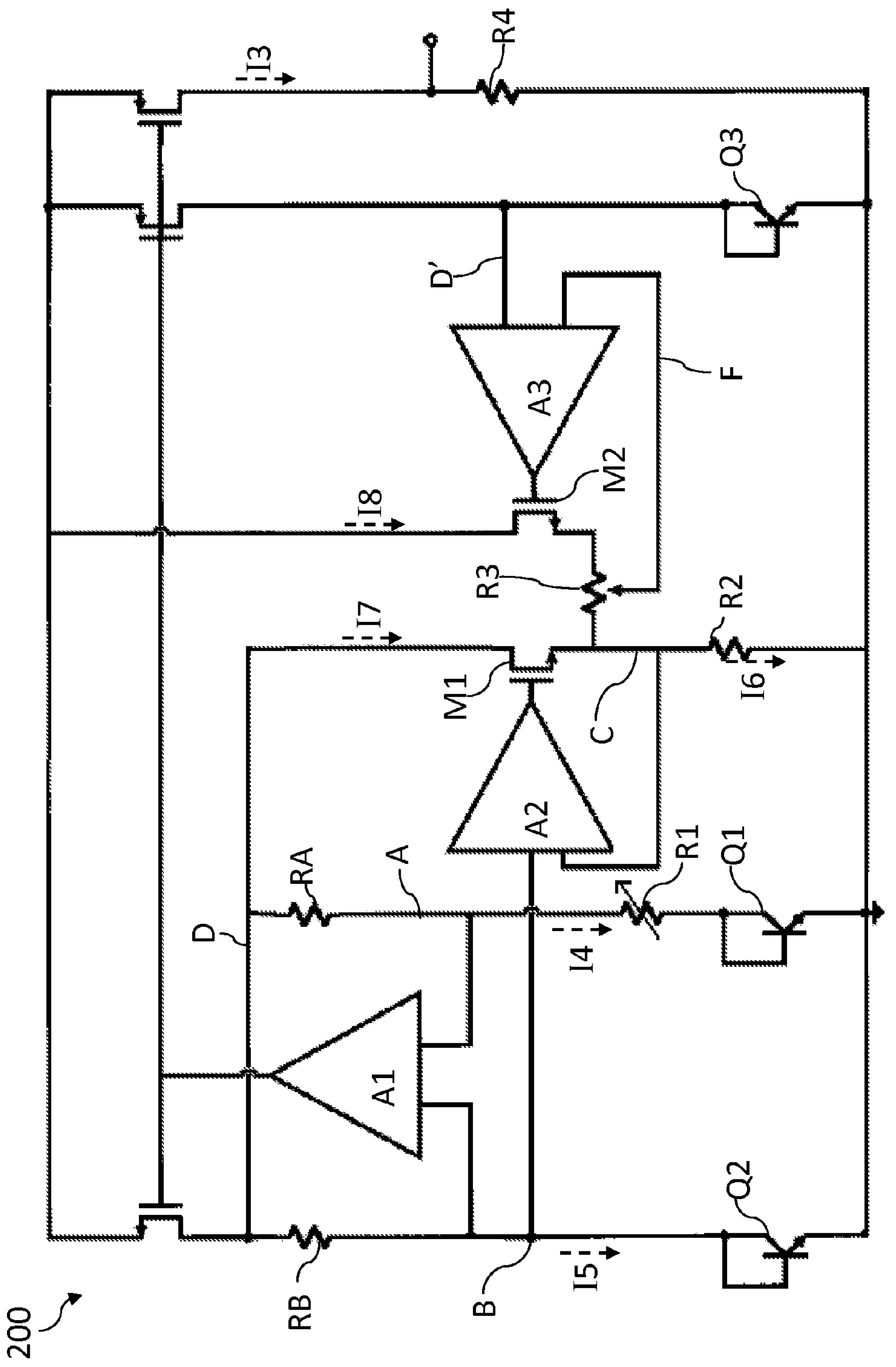
FIG. 2 illustrates a circuit diagram of an isolating, adjustable bandgap voltage-reference circuit in accordance with an embodiment of the invention.

In one embodiment, a circuit 200 (illustrated in FIG. 2) that implements the present invention includes three blocks or sections: a PTAT block (including a first BJT $Q_1$) for generating a PTAT current, a CTAT block (including a second BJT $Q_2$) for generating a CTAT current, and a nonlinear block (including a third BJT $Q_3$) for generating a nonlinear current proportional to $T \times \ln(T/T_0)$. Each block is explained in greater detail below; in summary, the PTAT block generates a PTAT current $I_4/I_5$ by adjusting the magnitudes of currents $I_4$ and $I_5$ and/or by trimming a resistor $R_1$; the CTAT block generates a CTAT current $I_6$ by buffering a negative-temperature-dependent voltage V(B) on a node B (which is the $V_{BE}$ of the second transistor $Q_2$) onto a resistor $R_2$, thereby generating the current $I_6$ as $V(B)/R_2$; and the nonlinear block generates the nonlinear current $I_8$ by subtracting V(B) from a voltage V(D) on a node D (which is the $V_{BE}$ of the third transistor $Q_3$), wherein $V_{BE}(Q_3) > V_{BE}(Q_2)$, thereby creating a current proportional to $T \times \ln(T/T_0)$ through a resistor $R_3$. This resistor $R_3$ may be adjusted to achieve the needed "α" coefficient value needed to cancel the non-linear component from the current flowing through $R_2$, resulting in a pure CTAT current $I_7$. The output reference voltage may be generated by summing the currents $I_4+I_5+I_7$ on node D (wherein current $I_7$ is the sum of $I_6$ and $I_8$, as computed on node C), mirroring the current, and passing the mirrored current through an output resistor $R_4$, as explained in greater detail below. $R_4$ may be matched to the other resistors $R_1$, $R_2$, $R_3$.

2. PTAT Current Generation

The PTAT currents $I_4$, $I_5$ may be generated by applying a voltage $\Delta V_{BE}$ (i.e., the difference between the base-emitter voltages $V_{BE}$ of the first transistor $Q_1$ and the second transistor $Q_2$) across $R_1$. The amplifier $A_1$ forces its two inputs (nodes A and B) to be the same voltage in accordance with its design parameters. Currents $I_4$ and $I_5$ are forced to be equal by equivalent resistors $R_A$ and $R_B$ (because node D is common to both resistors $R_A$ and $R_B$, their voltage drops V(DA) and V(DB) are equal, and therefore their currents $I_4$ and $I_5$ are equal). The gain of the first amplifier $A_1$ may be large enough such that any difference V(AB) that does develop between its inputs A, B (i.e., any difference that breaks the assumption that V(A)=V(B)) produces an error less than the maximum tolerable error for the circuit 200. In one embodiment, the overall accuracy of the circuit 200 depends not on the absolute value but on the relative mismatch between $R_A$ and $R_B$, which may be minimized via chopping (as explained in greater detail below), sizing, and/or layout technique.

Assuming N to be the ratio in size/strength between the first transistor $Q_1$ and the second transistor $Q_2$ and assuming the PTAT currents $I_4$ and $I_5$ to be equal for the reason described above, the difference between the respective $V_{BE}$ voltages of transistors $Q_1$ and $Q_2$ is shown below in Equation (2).

$$\Delta V_{BE}(T) = \frac{KT}{q}\ln N \tag{2}$$

In accordance with Equation (2), the resulting currents $I_4$ and $I_5$ are shown below in Equation (3).

$$I_4(T) = I_5(T) = \frac{KT}{qR_1}\ln N = \left(\frac{K}{qR_1}\ln N\right)T = \beta T \tag{3}$$

Thus, the PTAT currents are directly proportional to the temperature T in accordance with a scaling factor β.

3. CTAT Current Generation

To generate the CTAT component, the voltage V(B) on node B is buffered via a second amplifier $A_2$. The buffered voltage may be transformed into a current $I_6$ via a resistor $R_2$, which is of the same kind as, and sized proportionally to, the other resistors $R_1$, $R_3$, $R_4$. An NMOS transistor $M_1$ may be configured as a source-follower circuit between the second amplifier $A_2$ and the resistor $R_2$; the transistor $M_1$ may have its bulk and source terminals connected together in order to avoid or reduce asymmetric-leakage current injection from the source-bulk NP junction (which varies over temperature and may affect the accuracy of the circuit 200 if the transistor $M_1$ is not so configured).

Given the above configuration for the generation of the CTAT current, Equation (4) describes the voltage for a BJT base-to-emitter PN junction.

$$V_{BE}|_T = E_G - (E_G - V_{BE@T0})\frac{T}{T_0} - (XTI - \delta)\frac{KT}{q}\ln\frac{T}{T_0} \tag{4}$$

wherein $V_{BE@T0}$ is the voltage at temperature $T_0$, $E_G$ is the bandgap voltage, XTI is a process dependent parameter, and δ is a variable parameter equal either to −1 (for positive-temperature-coefficient bias current), +1 (for negative-temperature-coefficient bias current), or 0 (for constant over-temperature bias current).

Given the value for $I_5$ given in Equation (3), the voltage V(B) on node B has a temperature dependency described in Equation (5).

$$V_B = E_G - (E_G - V_{B@T0})\frac{T}{T_0} - (XTI - 1)\frac{KT}{q}\ln\frac{T}{T_0} \tag{5}$$

Equation (5) includes a constant term $E_G$, an inversely-proportional-to-temperature term $(E_G\text{-}V_{B@T0})T/T_0$ (which is the CTAT term), and a nonlinear term $(XTI-1)*KT/q*\ln(T/T_0)$. The CTAT term may be scaled and added to Equation (3) to thereby offset and eliminate both it and the PTAT term. A nonlinear current may be generated, as explained in greater detail below, to offset the nonlinear term in Equation (5).

4. Nonlinear Current Generation

The third transistor $Q_3$ is biased with a replica of the output current $I_4+I_5+I_7$ (via use of a current mirror). The node D' connected to the third transistor is therefore at the same potential as the node D that sums the currents $I_4$, $I_5$, $I_7$ (in other words, V(D)=V(D')). The voltage V(D) is, to first approximation, constant in temperature, which results in a voltage $V_D$ given below by Equation (6).

$$V_D = E_G - (E_G - V_{D@T0})\frac{T}{T_0} - XTI\frac{KT}{q}\ln\frac{T}{T_0} \tag{6}$$

The difference between the voltages V(D) and V(B) is transformed into a current $I_8$ via the third amplifier $A_3$ and the resistor $R_3$ (which is, as mentioned above, of the same kind as and sized proportionally to $R_1$, $R_2$, and $R_4$). The resulting currents $I_6$ and $I_8$ are given below by Equations (7) and (8).

$$I_6 = \frac{E_G - (E_G - V_{B@T0})\frac{T}{T_0} - (XTI - 1)\frac{KT}{q}\ln\frac{T}{T_0}}{R_2} \tag{7}$$

$$\begin{aligned} I_8 &= \frac{\left(E_G - (E_G - V_{D@T0})\frac{T}{T_0} - XTI\frac{KT}{q}\ln\frac{T}{T_0}\right) - \left(E_G - (E_G - V_{B@T0})\frac{T}{T_0} - (XTI - 1)\frac{KT}{q}\ln\frac{T}{T_0}\right)}{R_3} \\ &= \frac{(V_{D@T0} - V_{B@T0})\frac{T}{T_0} - \frac{KT}{q}\ln\frac{T}{T_0}}{R_3} \end{aligned} \tag{8}$$

Note that the nonlinear current $I_6$, does not affect the results of Equations (5) and (6) due at least in part to the presence of the amplifiers $A_2$ and $A_3$ and its isolation from the generation of currents $I_4$ and $I_5$. Furthermore, because the amplifier $A_3$ isolates the current $I_8$, that current does not affect the output current $I_3$.

A second NMOS transistor $M_2$ may be configured as a second source follower; its body effect is absorbed by its configuration. The gain of the third amplifier $A_3$ is, in one embodiment, large enough to guarantee that its input voltage V(DF) is much less than the maximum error allowed to achieve the target precision of the circuit 200 (like the first and second amplifiers $A_1$, $A_2$). The resistance of the resistor $R_3$ may be changed by tapping it using an input of the third amplifier $A_3$.

The voltage V(D) on node D has a logarithmic relationship with $I_3$, so the current $I_3$ need not be precisely matched with the sum of the currents $I_4$, $I_5$, $I_7$. The resulting current $I_7$, on node C, is given by the sum of currents $I_6$ and $I_8$ in accordance with Equation (9).

$$I_7 = \frac{E_G - (E_G - V_{B@T0})\frac{T}{T_0} - (XTI - 1)\frac{KT}{q}\ln\frac{T}{T_0}}{R_2} - \frac{(V_{D@T0} - V_{B@T0})\frac{T}{T_0} - \frac{KT}{q}\ln\frac{T}{T_0}}{R_3} \quad (9)$$

The overall current $I_9$ resulting from summing currents $I_4$, $I_5$, $I_7$ is given by Equation (10), $$\begin{aligned} I_9 &= \frac{E_G - (E_G - V_{B@T0})\frac{T}{T_0} - (XTI - 1)\frac{KT}{q}\ln\frac{T}{T_0}}{R_2} - \frac{(V_{D@T0} - V_{B@T0})\frac{T}{T_0} - \frac{KT}{q}\ln\frac{T}{T_0}}{R_3} + 2\frac{KT}{qR_1}\ln N \\ &= \left(2\frac{K}{qR_1}\ln N\right)T + \beta\frac{T}{T_0} + \alpha T\ln\frac{T}{T_0} \end{aligned} \quad (10)$$

in which $I_4$ and $I_5$ are assumed to be equal.

It may be derived that by satisfying the relationship shown in Equation (11), $$\frac{(XTI - 1)}{R_2} = \frac{1}{R_3} \rightarrow \frac{R_2}{R_3} = XTI - 1 \quad (11)$$

the coefficient "α" shown in Equation (10) becomes zero, which in turn simplifies Equation (10) into the form shown below in Equation (12).

$$I_9 = 2\frac{KT}{qR_1}\ln N + \frac{E_G - (E_G - V_{B@T0})\frac{T}{T_0}}{R_2} - \frac{(V_{D@T0} - V_{B@T0})\frac{T}{T_0}}{R_3} = \frac{E_G}{R_2} + \gamma T + \beta T \quad (12)$$

The coefficients β and γ (related to PTAT and CTAT, respectively) are, in first approximation, given by Equation (13).

$$\beta = -\left(\frac{V_{D@T0}}{R_3} + \frac{E_G}{R_2}\right)\frac{1}{T_0} \text{ and } \gamma = 2\frac{K}{qR_1}\ln N + \left(\frac{R_2 + R_3}{R_2 R_3}\right)\frac{V_{B@T0}}{T_0} \quad (13)$$

Given the process-dependent XTI value in Equation (11), the ratio between $R_1$ and $R_2$ may be determined by equating the γ and β coefficients given in Equation (13), as shown below in Equation (14). This ratio may be used to choose relative sizes for $R_1$ and $R_2$ to achieve a constant-over-temperature reference output.

$$\frac{R_1}{R_2} = 2\frac{KT_0}{q}\frac{1}{E_G(XTI - 1) + V_{D@T0} - V_{B@T0}XTI}\ln N \quad (14)$$

5. Additional Features

Figure 3:
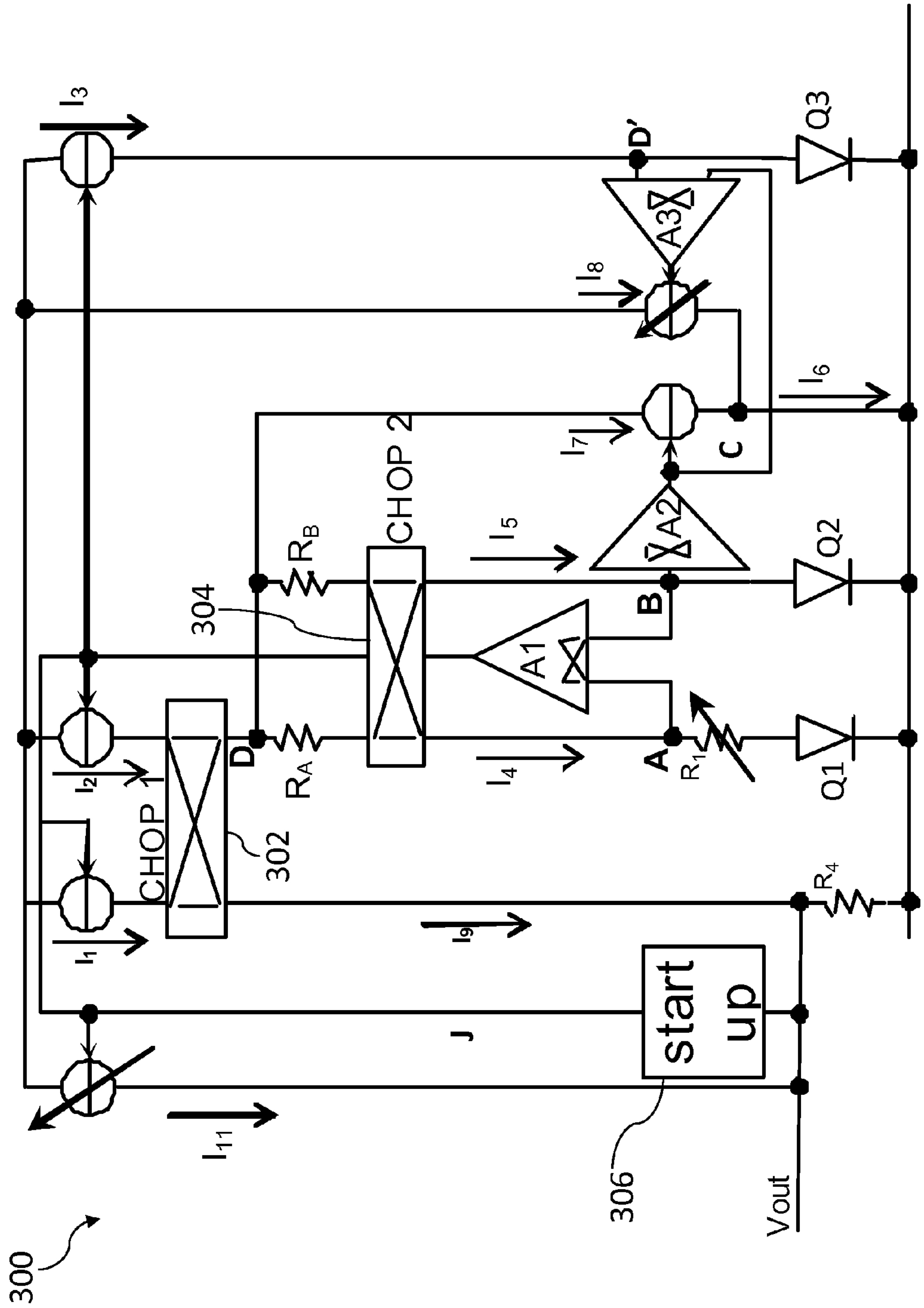
FIG. 3 illustrates a block diagram of an isolating, adjustable bandgap voltage-reference circuit in accordance with an embodiment of the invention.

A block diagram of another circuit 300 configured in accordance with an embodiment of the current invention is shown in FIG. 3. The circuit 300, like the circuit 200 shown in FIG. 2, includes transistors $Q_1$, $Q_2$, $Q_3$ (shown here as diodes) for generating the PTAT, CTAT, and nonlinear currents, respectively, and amplifiers $A_1$, $A_2$, $A_3$ for isolating generation of the currents. Other parts of the circuit 300 are analogous to similarly named parts of the circuit 200 shown in FIG. 2, such as the PTAT currents $I_4/I_5$, the CTAT current $I_7$, and the nonlinear current $I_8$.

The circuit 300 includes chopping elements 302, 304 to reduce mismatch between various components in the circuit. "Chopping" refers to a technique for averaging or balancing two (or more) similar currents, voltages, or components to reduce or eliminate any discrepancies between them; it works by periodically swapping and re-swapping the chosen parameters. For example, in the circuit 300, currents $I_4$ and $I_5$ are, ideally, identical, but a mismatch between resistors $R_A$ and $R_B$ (among other reasons) may create a difference between them. The chopping element 304 draws current $I_4$ from resistor $R_A$ and current $I_5$ from resistor $R_B$ during the first half of a period T (as would have been the case had there been no chopping element 304). During the second half of the period T, however, the chopping element 304 swaps the currents such that current $I_4$ is drawn from resistor $R_B$ and current $I_5$ is drawn from resistor $R_A$. Thus, over many periods T, the input to the second amplifier $A_2$ (for example) averages between the currents $I_4$ and $I_5$, and any differences between the currents is averaged. The chopping element 304 thus reduces the matching requirements and thus the sizing of resistors $R_A$ and $R_B$. Chopping element 302 similarly chops currents $I_1$ and $I_2$; this chopping may help maintain a close match between the summed currents $I_4+I_5+I_7$ and the output current $I_3$, thus easing the design requirements for precision of the current mirrors (i.e., reducing their size).

The amplifiers $A_1$, $A_2$, $A_3$ may similarly chop their input signals to attenuate any temperature- or process-dependent effects on the amplifiers, thus reducing any input offset. This additional boost to the precision of the amplifiers $A_1$, $A_2$, $A_3$ may ease the maximum input offset allowed for the amplifiers, thereby decreasing their size. The chopping of the amplifiers $A_1$, $A_2$, $A_3$ (or of the chopping elements 302, 304) may introduce a frequency component into the operation of the circuit 300; this frequency component, however, may be filtered by various techniques known in the art (e.g., sampling/averaging the reference value at a specific frequency or low-pass filtering the frequency component with passive or active filters) or may be inherently filtered by another circuit or circuits using/interfacing with the reference circuit 300 (i.e., the frequency component may be too fast for those other circuits to even detect it).

In one embodiment, the chopping of the amplifiers $A_1$, $A_2$, $A_3$ occurs at the same frequency. The first 302 and/or second chopping elements 304 may run at a fraction of that frequency (e.g., half) in order to, e.g., avoid working against the chopping of the first amplifier $A_1$. As described above, the chopping of the amplifiers $A_1$, $A_2$, $A_3$ may reduce their sizes, while the second chopping element 304 (i.e., chopping of $R_A/R_B$) may increase the performance (i.e., accuracy) of the bandgap circuit 300 for a given size (or, correspondingly, reduce the size requirement for a given accuracy).

The circuit 300 further includes a startup circuit 306 to assure that it starts properly when the power supply is ramped from zero up to its nominal operating value. The startup circuit 306 pulls node J toward ground when the output voltage $V_{out}$ is below a certain threshold, $V_{STUP}$; when $V_{out}>V_{STUP}$, the startup circuit 306 releases node J, and $V_{out}$ continues to rise toward its steady-state voltage value.

Figure 4:
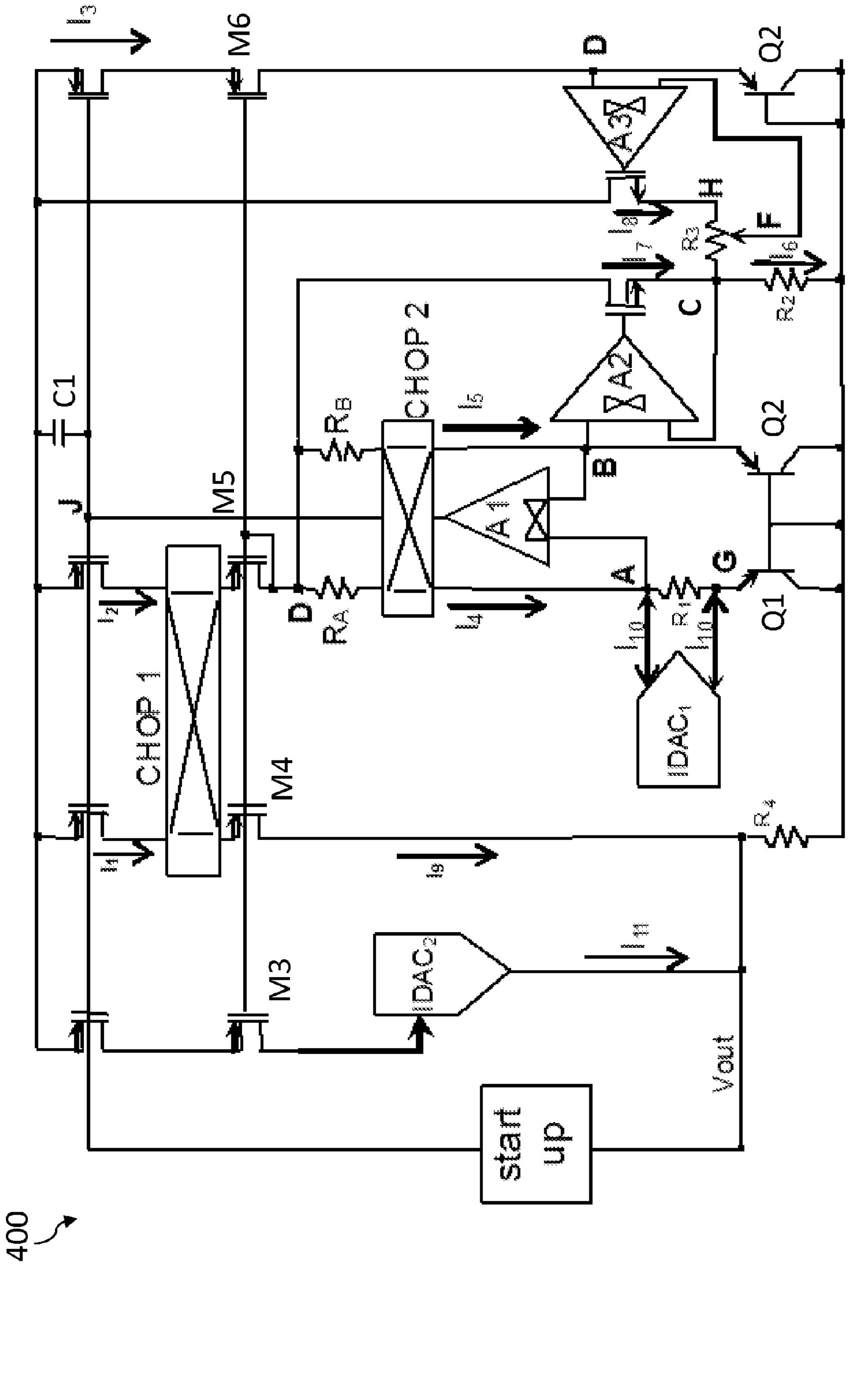
FIG. 4 illustrates a transistor-level implementation of an isolating, adjustable bandgap voltage-reference circuit in accordance with an embodiment of the invention.

FIG. 4 illustrates another transistor-level circuit 400 implementing another embodiment of the current invention that includes one method of trimming the resistor $R_1$. The resistor $R_1$ may be trimmed to match the needed ratio between PTAT and CTAT (in accordance with Equation (14)) for the first-order temperature compensation. In one embodiment, a current DAC $IDAC_1$ is used to trim resistor $R_1$, thereby avoiding any parasitic resistance in the path of the current $I_4$ flowing through the resistor $R_1$ (which would result in a voltage drop having a temperature coefficient different from the voltage across $R_1$). The use of transistor-based switches, for example, to short or insert parts of $R_1$ would create such a situation and introduce a different temperature coefficient into the circuit 200.

Instead, the current DAC $IDAC_t$ adjusts the apparent value of $R_1$. In order to raise the apparent value of $R_1$, $IDAC_t$ injects a PTAT current $I_{10}$ in node A and subtracts the same amount of current $I_{10}$ from node G. Therefore, the voltage drop between node A and G is given by Equation (15). The apparent value of $R_1$ may be lowered in a similar fashion.

$$\Delta V_{AG}=R_1I_4+R_1I_{10}=R_1(I_4+I_{10}) \tag{15}$$

The effective resistance of the resistor $R_1$ may thus be expressed by Equation (16).

$$R_{1effective}=\frac{\Delta V_{AG}}{I_4}=\frac{R_1(I_4+I_{10})}{I_4}=R_1\left(1+\frac{I_{10}}{I_4}\right) \tag{16}$$

Despite the use of the current DAC $IDAC_1$ and the injected/subtracted current $I_{10}$, the current flowing into the first transistor $Q_1$ is still $I_4$.

A second current DAC $IDAC_2$ may also be used. If the XTI value determined by simulation and used to design the circuit 400 differs from the actual, measured value of XTI determined after the circuit has been manufactured, the value of resistor $R_4$ may be trimmed to adjust the final output voltage $V_{out}$. The second current DAC $IDAC_2$ thus compensates for any possible discrepancy in XTI in addition to compensating for any mismatch between $R_4$ and $R_1$, $R_2$, or $R_3$ (which may introduce a gain error in the output $V_{out}$) and/or any mismatch in the current mirrors. In some embodiments, a filter capacitor $C_1$ is used to compensate the first amplifier $A_1$ and to low-pass filter any frequencies injected into the circuit 400 by the chopping elements 302, 304. Cascode devices M3-M6 may be used to improve current-matching between the blocks of the circuit 400.

Figure 5:
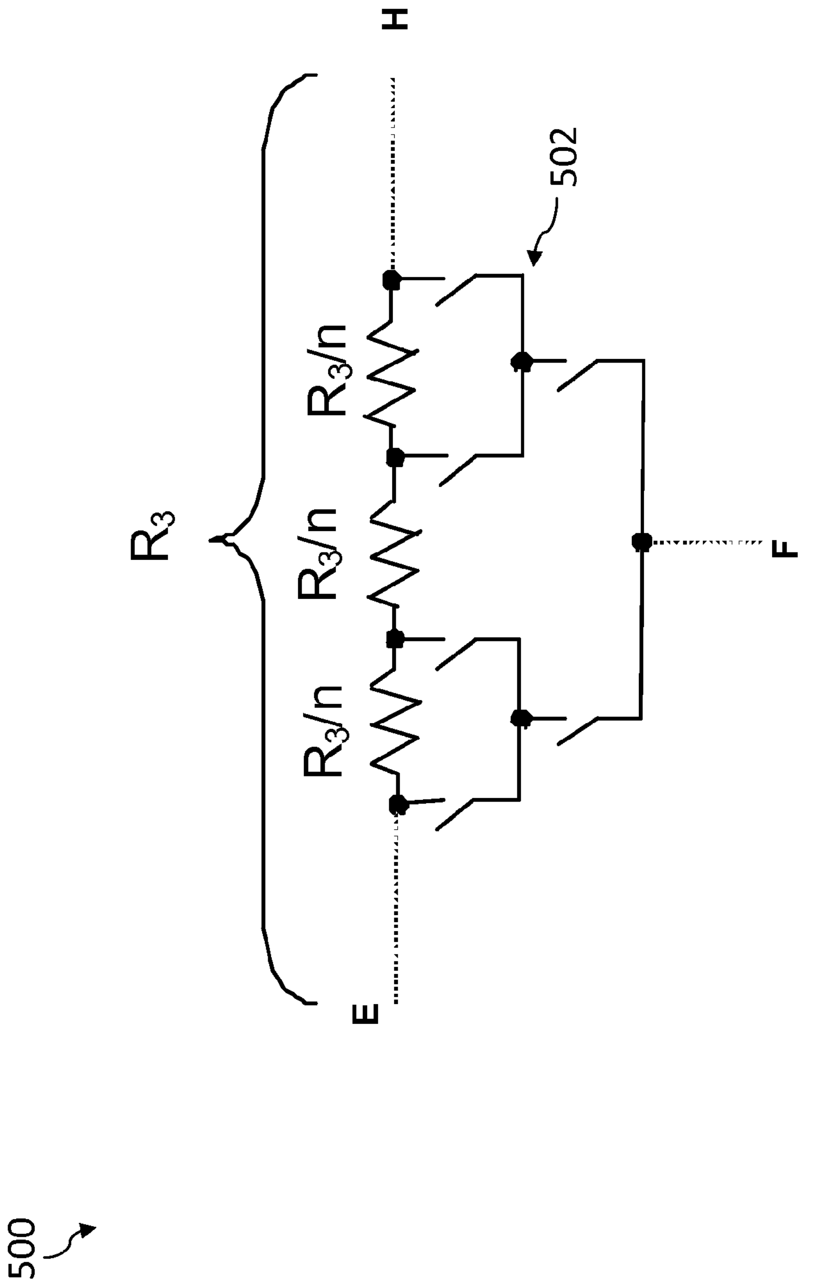
FIG. 5 illustrates an implementation of a trimming circuit in accordance with an embodiment of the invention.

One embodiment of the trimmable resistor $R_3$ (used, as described above, to adjust the $\alpha$ coefficient and cancel out the second-order temperature component) is shown in the circuit 500 of FIG. 5. The total resistance of the resistor $R_3$ is divided into sections, and the tap input at node F is connected to one of the points between or adjacent to the sections by a switching network 502, which may use MOS transistors as the switches. This implementation 500 does not insert any switches between the end nodes E, H of the resistor, thereby preventing any insertion of a MOS-based temperature dependency into the resistance $R_3$. Any leakage current from the switches 502 may be compensated by $I_8$ and thus not affect $I_7$. The switches 502 may be programmed after manufacture of the circuit 500 via a programmable control register (accessible via, for example, a JTAG port), by blowing fuses, or by any other means known in the art.

Figure 6:
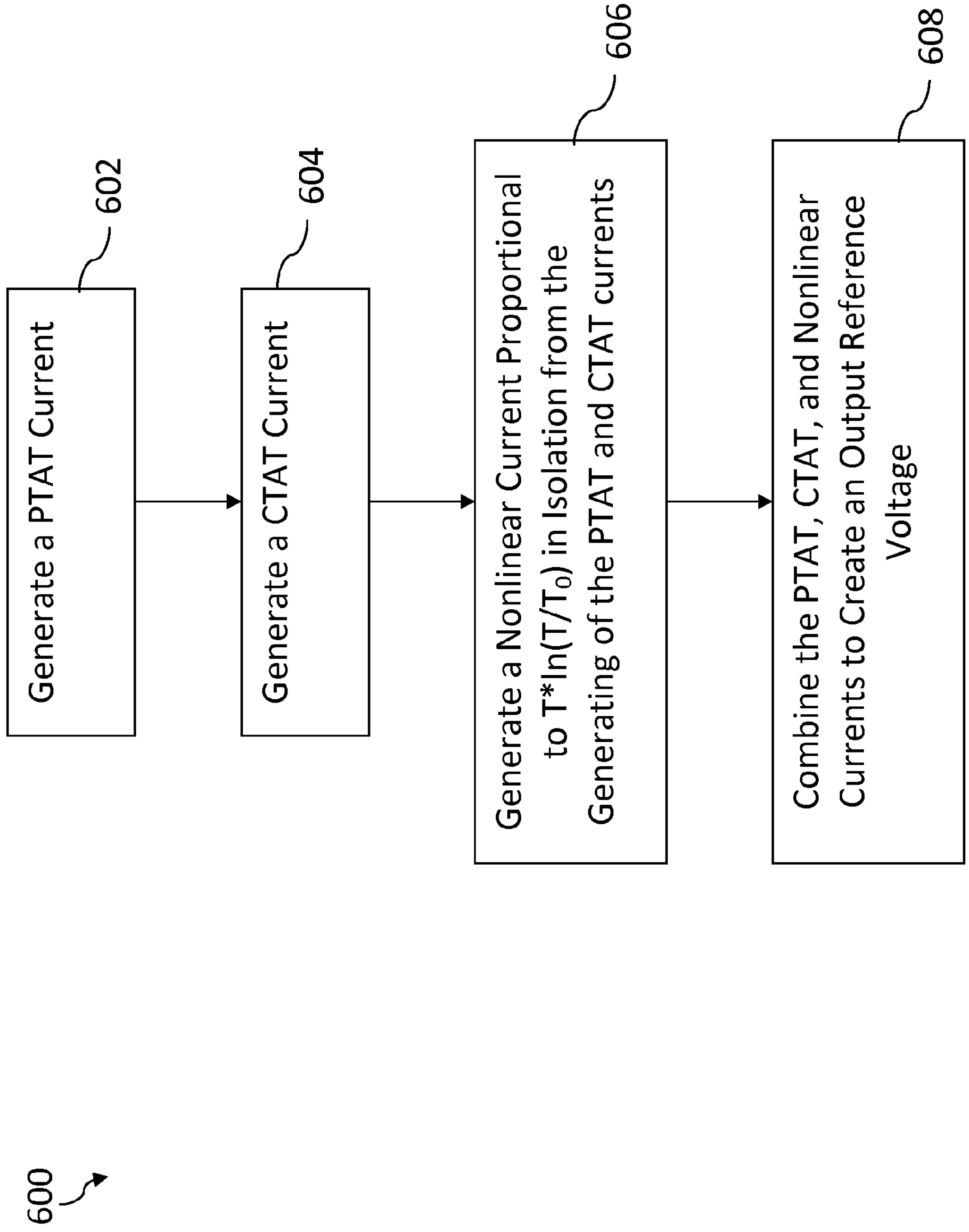
FIG. 6 illustrates a flowchart for generating an isolating, adjustable bandgap voltage reference in accordance with an embodiment of the invention.

FIG. 6 illustrates a method 600 for generating a reference voltage. A PTAT current is generated in a first step 602, and a CTAT current is generated in a second step 604. In a third step 606, a nonlinear current, proportional to $T\times\ln(T/T_0)$, is generated in isolation from the generating of the PTAT and CTAT currents. As explained above, the generation in isolation is defined by the magnitude of the nonlinear current having no effect on the PTAT and CTAT currents, and vice versa. In a fourth step 608, the currents are combined to create an output reference voltage.

Figure 7:
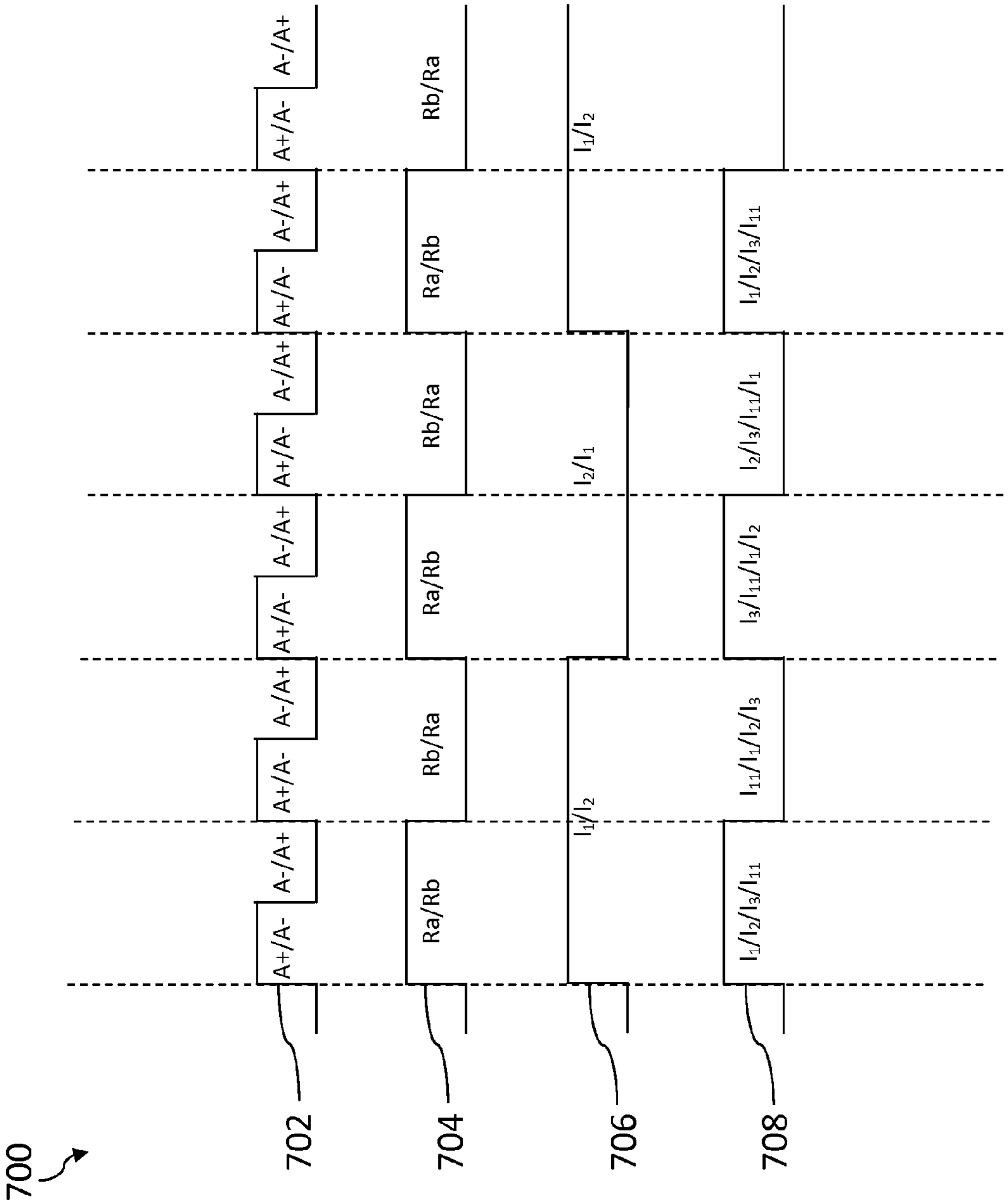
FIG. 7 illustrates a timing diagram for chopping in accordance with an embodiment of the invention.

FIG. 7 illustrates additional chopping schemes 700 that may be used in embodiments of the current invention. A first switching frequency 702 may be used to supply the chopping for the amplifiers $A_1$, $A_2$, $A_3$ between their inputs A+ and A−. A second frequency 704, which is one-half of the first switching frequency 704, may be used by the second chopping unit 304 to chop the resistors $R_A$, $R_B$. In one embodiment, a third frequency 706 is used by the first chopping unit 302 to chop the currents $I_1$ and $I_2$; this third frequency 706 may be one-half of the second frequency 704 and one-quarter of the first frequency 702. In another embodiment, the currents $I_1$ and $I_2$ are chopped together with the currents $I_3$ and $I_{11}$ in accordance with the fourth frequency 708. In this embodiment, the four currents are rotated in a first phase $I_1$, $I_2$, $I_3$, $I_{11}$, a second phase $I_{11}$, $I_1$, $I_2$, $I_3$, a third phase $I_3$, $I_{11}$, $I_1$, $I_2$ and a fourth phase $I_2$, $I_3$, $I_{11}$, $I_1$ to further improve the performance of the circuit 300.

Certain embodiments of the present invention were described above. It is, however, expressly noted that the present invention is not limited to those embodiments, but rather the intention is that additions and modifications to what was expressly described herein are also included within the scope of the invention. Moreover, it is to be understood that the features of the various embodiments described herein were not mutually exclusive and can exist in various combinations and permutations, even if such combinations or permutations were not made express herein, without departing from the spirit and scope of the invention. In fact, variations, modifications, and other implementations of what was described herein will occur to those of ordinary skill in the art without departing from the spirit and the scope of the invention. As such, the invention is not to be defined only by the preceding illustrative description.

What is claimed is:

1. A system for generating a voltage reference, the system comprising:

a first block for generating a proportional-to-absolute-temperature ("PTAT") current;

a second block for generating a complementary-to-absolute-temperature ("CTAT") current;

a third block for generating a nonlinear current in isolation from the generating of the PTAT and CTAT currents; and an output circuit for combining the PTAT current, CTAT current, and nonlinear current to create an output reference voltage.

2. The system of claim 1, wherein the nonlinear current is proportional to $T\times\ln(T/T_0)$.

3. The system of claim 1, wherein the first block comprises a trimmable resistor for balancing first-order components of the PTAT and CTAT currents.

4. The system of claim 3, further comprising a current DAC for trimming the trimmable resistor.

5. The system of claim 1, further comprising a current DAC for compensating for a process-dependent value by trimming an output resistance.

6. The system of claim 1, wherein the third block further comprises a trimmable resistor for adjusting the nonlinear current to cancel out second-order effects of temperature from the PTAT and CTAT currents.

7. The system of claim 1, wherein the third block further comprises a BJT with an inaccessible collector terminal.

8. The system of claim 1, wherein an amplifier isolates the nonlinear current and wherein the amplifier comprises a chopping circuit for chopping its input values.

9. The system of claim 1, wherein the first block comprises a chopping circuit for chopping resistors used to generate the PTAT current.

10. The system of claim 1, further comprising a chopping circuit for chopping an output current.

11. A method of generating a voltage reference, the method comprising:

generating a proportional-to-absolute-temperature ("PTAT") current;

generating a complementary-to-absolute-temperature ("CTAT") current;

generating a nonlinear current in isolation from the generating of the PTAT and CTAT currents; and combining the PTAT current, CTAT current, and nonlinear current to create an output reference voltage.

12. The method of claim 11, wherein the nonlinear current is proportional to $T \times \ln(T/T_0)$.

13. The method of claim 11, further comprising adjusting a ratio between the PTAT and CTAT currents to cancel out first-order effects of temperature in the PTAT and CTAT currents.

14. The method of claim 13, wherein adjusting the ratio comprises trimming a resistor.

15. The method of claim 11, further comprising adjusting a scaling factor applied to the nonlinear current to cancel out second-order effects of temperature from the PTAT and CTAT currents.

16. The method of claim 15, wherein adjusting the scaling factor comprises trimming a resistor.

17. The method of claim 11, further comprising chopping two parameters to reduce a mismatch between circuit components.

18. The method of claim 17, wherein the parameters are PTAT currents and the circuit components are resistors.

19. The method of claim 11, further comprising compensating for a process-dependent variable.

20. The method of claim 19, wherein compensating for the process-dependent variable comprises trimming an output resistor.

* * * * *